US007968214B2

(12) United States Patent
Noh et al.

(10) Patent No.: US 7,968,214 B2
(45) Date of Patent: Jun. 28, 2011

(54) WHITE ORGANIC LIGHT EMITTING DEVICE

(75) Inventors: Tae-yong Noh, Yongin-si (KR); Junji Kido, Yokohama (JP); Shinichiro Tamura, Yongin-si (KR); Euk-che Hwang, Yongin-si (KR)

(73) Assignee: Samsung Electronics Co., Ltd. (KR)

( * ) Notice: Subject to any disclaimer, the term of this patent is extended or adjusted under 35 U.S.C. 154(b) by 795 days.

(21) Appl. No.: 11/946,275

(22) Filed: Nov. 28, 2007

(65) Prior Publication Data

US 2008/0171226 A1 Jul. 17, 2008

(30) Foreign Application Priority Data

Jan. 12, 2007 (KR) .................. 10-2007-0003959

(51) Int. Cl.
H01L 51/54 (2006.01)
(52) U.S. Cl. ......... 428/690; 428/917; 313/504; 313/506
(58) Field of Classification Search .................. None
See application file for complete search history.

(56) References Cited

U.S. PATENT DOCUMENTS

| 6,337,492 | B1* | 1/2002 | Jones et al. ............. 257/40 |
| 7,227,304 | B2* | 6/2007 | Tsujimura et al. ........ 313/506 |
| 7,273,663 | B2* | 9/2007 | Liao et al. ............. 428/690 |
| 2002/0197511 | A1* | 12/2002 | D'Andrade et al. ....... 428/690 |
| 2003/0189401 | A1 | 10/2003 | Kido et al. |
| 2005/0140275 | A1 | 6/2005 | Park |
| 2005/0164033 | A1* | 7/2005 | Chin et al. ............. 428/690 |
| 2005/0206305 | A1 | 9/2005 | Masuda et al. |
| 2005/0264174 | A1* | 12/2005 | Liao et al. ............. 313/500 |
| 2006/0040132 | A1 | 2/2006 | Liao et al. |
| 2006/0081840 | A1* | 4/2006 | Mori et al. ............. 257/40 |
| 2006/0188745 | A1* | 8/2006 | Liao et al. ............. 428/690 |
| 2006/0227079 | A1* | 10/2006 | Kashiwabara ............ 345/76 |
| 2006/0273714 | A1* | 12/2006 | Forrest et al. .......... 313/504 |
| 2006/0289882 | A1 | 12/2006 | Nishimura et al. |
| 2007/0182317 | A1* | 8/2007 | Kido et al. ............. 313/504 |
| 2007/0200124 | A1* | 8/2007 | Suzuri et al. ........... 257/89 |

FOREIGN PATENT DOCUMENTS

| CN | 1447629 A | 10/2003 |
| CN | 1638570 A | 7/2005 |
| EP | 1 351 558 A1 | 10/2003 |
| JP | 2005 150084 A | 6/2005 |
| JP | 2006324016 A | 11/2006 |
| KR | 10 2005 0028564 A | 3/2005 |
| WO | WO 2005/027586 * | 3/2005 |

OTHER PUBLICATIONS

Japanese Office Action with English Translation for Application No. 200810002945.1 dated Jun. 15, 2010.

(Continued)

Primary Examiner — Dawn L Garrett
(74) Attorney, Agent, or Firm — Cantor Colburn LLP (57) ABSTRACT

Provided is a white organic light emitting device comprising an anode, a cathode, and an organic layer formed between the anode and the cathode, wherein the organic layer comprises one green emissive layer, one blue emissive layer, one red emissive layer, and one charge generating layer formed between any two of the foregoing green, blue and red emissive layers. The white organic light emitting device has a tandem structure providing the simplest structure for the three color light emissions of green, blue and red.

12 Claims, 3 Drawing Sheets

OTHER PUBLICATIONS

European Search Report for Application No. 08150077.9-1235/1944809 dated Jul. 20, 2010.

Tsai, et al., Long-lifetime, high-efficiency white organic light-emitting diodes with mixed host composing double emission layers, Applied Physics Letters 89, 243521 and 243521-3 (2006).

Kanno, et al., Development of OLED With High Stability and Luminance Efficiency by Co-Doping Methods for Full Color Displays, IEEE Journal of Selected Topics in Quantum Electornics, vol. 10, No. 1, Jan./Feb. 2004, pp. 30-36.

* cited by examiner

FIG. 2B

WHITE ORGANIC LIGHT EMITTING DEVICE

CROSS-REFERENCE TO RELATED PATENT APPLICATION

This application claims priority to Korean Patent Application No. 10-2007-0003959, filed on Jan. 12, 2007, and all the benefits accruing therefrom under 35 U.S.C. §119, the disclosure of which is incorporated herein in its entirety by reference.

BACKGROUND OF THE INVENTION

1. Field of the Invention

The present disclosure relates to a white organic light emitting device which has excellent color purity and improved light emissive efficiency, and which can be manufactured using a simple manufacturing process.

2. Description of the Related Art

Organic light emitting devices are self-emissive devices that function through the use of electroluminescence thereby having a high degree of pattern recognition ability. In addition, organic light emitting devices are complete, solid, devices thereby having excellent impact resistance. As a result, organic light emitting devices are the focus of considerable attention for their potential application to all kinds of display devices.

Organic light emitting devices have a basic structure comprising an anode, an organic emissive layer, and a cathode, and can further comprise a hole injection layer, a hole transport layer, an electron injection layer, or the like. Examples of different structures include, an anode/hole injection layer/hole transport layer/organic emissive layer/cathode structure, and an anode/hole injection layer/hole transport layer/organic emissive layer/electron injection layer/cathode structure.

The development of organic light emitting display devices, in particular, white organic light emitting devices, has been an ongoing focus of research activity.

White organic light emitting devices are organic light emitting devices that emit white light, and can be used for various applications such as paper-thin light sources, backlights for liquid crystal display devices, or light sources for full-color display devices employing color filters.

Methods of forming an emissive layer for a white organic light emitting device can be categorized into two types. One is a method of forming a single emissive layer, and the other is a method of forming multiple emissive layers.

A single emissive layer can be prepared using a single material or, by doping or blending at least two types of materials. For example, the single emissive layer can be formed using red and green dopants with a blue host, or by using red, green and blue dopants with a host material having a large band gap energy. However, in these examples, energy transfer into the dopant is incomplete. Alternatively, the single emissive layer can be formed using a bipolar host material having a red, green, or blue luminescence moiety. However, in this case, the white balance cannot be easily adjusted.

A white organic light emitting device comprising multiple emissive layers can be categorized into both a 3-wavelength, white organic light emitting device, comprising a red emissive layer, a green emissive layer and a blue emissive layer; and a 2-wavelength white organic light emitting device, using colors which are complementary to either red, green or blue.

In the case of the 2-wavelength, white organic light emitting device using complementary colors for either red, green or blue, a high degree of energy transfer efficiency can be obtained. However, one of the drawbacks to the 2-wavelength method is that white is obtained through the use of complementary colors, and consequently it is very difficult to achieve a full range of colors using color filters, and thus the range of colors that can be expressed is narrow. Meanwhile, in the case of the 3-wavelength white organic light emitting device, a uniform spectrum of the three colors, that is, red, green, and blue, cannot be achieved due to the energy transfer between molecules, and consequently the light emission efficiency is still low.

Korean Patent Publication No. 2005-0028564 discloses a method of manufacturing a white organic light emitting device comprising: doping any one pigment selected from green and red, on a portion or whole portion, of any one of a hole transport layer and an electron transport layer, that are formed on upper and lower surfaces of a blue emissive layer; and doping the other one of the green and red pigment on the other layer of the hole transport layer and the electron transport layer. In addition, Japanese Patent Laid-Open Publication No. 2005-150084 discloses a white organic light emitting device in which a double hole blocking layer, comprising a first hole blocking layer, a hole transport layer, and a second hole blocking layer, is formed between an anode and an emissive layer, thereby having high color purity and luminescence in spite of the structure of the emissive layer which comprises a green emissive layer, a blue emissive layer and a red emissive layer which are formed in that order. The white organic light emitting device is manufactured using a simple manufacturing process, but it still has low level of light emission efficiency and color purity.

Figure 1A:
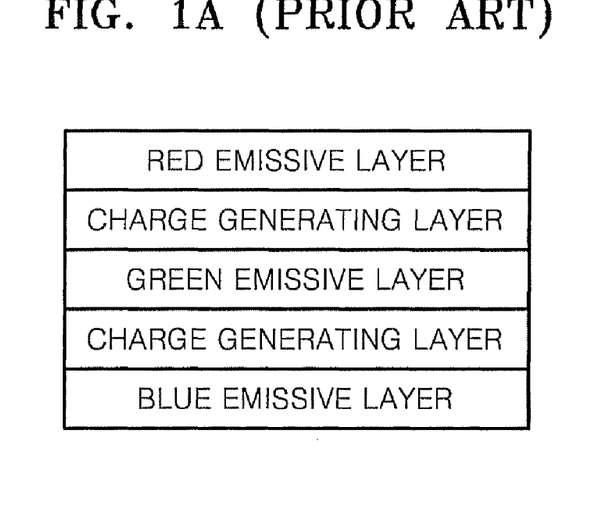
FIGS. 1A and 1B are schematic cross-sectional views illustrating the emissive layer structure of a prior art white organic light emitting device having a tandem structure.

U.S. Patent Publication No. 2003/0189401, filed by IMES (International Manufacturing and Engineering Services., Co., Ltd.), discloses an organic electroluminescent device, capable of emitting white light, comprising at least two light emitting units formed between a cathode and an anode, that each comprise at least one emissive layer, wherein the light emitting units are separated by at least one charge generating layer. The white organic light emitting device has a tandem structure such that a charge generating layer (CGL) is formed between the light emitting units, as illustrated in FIG. 1A. The white organic light emitting device has an improved light emission efficiency, but the color adjustment is problematic due to an overall light interference effect produced as a result of an increase in the thickness of the emissive layers.

Figure 1B:
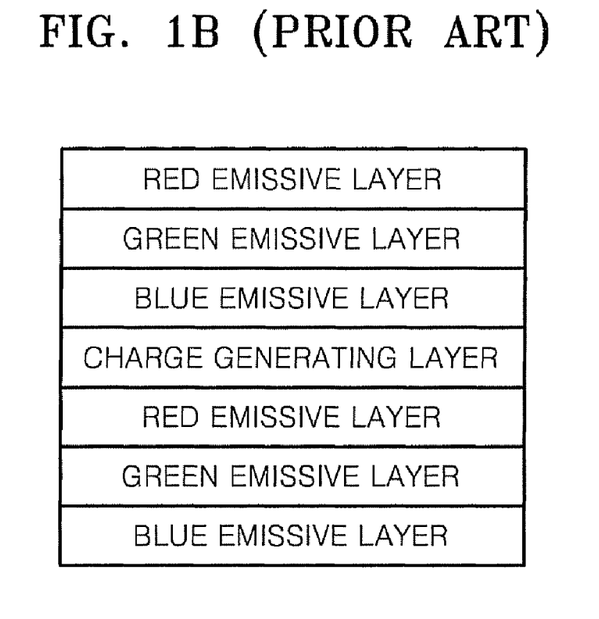

U.S. Patent Publication No. 2006/0040132 discloses a white organic light emitting device having a tandem structure such that a plurality of light emitting units are formed between a cathode and an anode, a connector is formed between the adjacent light emitting units, and each of the light emitting units emit white light. The white organic light emitting device (illustrated in FIG. 1B), has excellent light emission efficiency. However, the manufacturing process for this device is complex, and due to the long light path of the device the, color adjustment is also difficult.

SUMMARY OF THE INVENTION

As described herein, a white organic light emitting device is provided having a simple tandem structure, excellent light emission efficiency, and in which color adjustment is easily achievable.

According to one aspect, there is provided a white organic light emitting device comprising an anode, a cathode, and an organic layer formed between the anode and the cathode, wherein the organic layer comprises one green emissive layer, one blue emissive layer, one red emissive layer and one charge generating layer formed between any two of the foregoing green, blue and red emissive layers.

According to another aspect, the charge generating layer can be formed of an aryl amine-based organic compound, a metal, metal oxides, metal carbides, metal fluorides, or mixtures thereof.

According to yet another aspect, the green emissive layer, the blue emissive layer and the red emissive layer can each comprise a host material, and a fluorescent or phosphorescent light emitting material as a dopant.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE INVENTION

The present invention will now be described more fully with reference to the accompanying drawings, in which exemplary embodiments of the invention are shown.

It will be understood that when an element or layer is referred to as being "on," "interposed," "disposed," or "between" another element or layer, it can be directly on, interposed, disposed, or between the other element or layer or intervening elements or layers can be present.

It will be understood that, although the terms first, second, third, and the like can be used herein to describe various elements, components, regions, layers and/or sections, these elements, components, regions, layers and/or sections should not be limited by these terms. These terms are only used to distinguish one element, component, region, layer or section from another element, component, region, layer or section. Thus, first element, component, region, layer or section discussed below could be termed second element, component, region, layer or section without departing from the teachings of the present invention.

As used herein, the singular forms "a," "an" and "the" are intended to comprise the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

The present disclosure provides a white organic light emitting device having a tandem structure, that can be obtained by forming a charge generating layer between colour emissive layers. The white organic light emitting device has excellent colour purity and light emission efficiency and, can be manufactured using simple processes.

In one embodiment, the white organic light emitting device comprises an anode, a cathode, and an organic layer formed between the anode and the cathode. The organic layer comprises one green emissive layer, one blue emissive layer, one red emissive layer, and one charge generating layer formed between any two of the foregoing green, blue and red emissive layers.

The white organic light emitting device has a higher, or similar, light emission efficiency and higher color purity as compared to devices where green, blue and red emissive layers are simply formed, or when a charge generating layer is formed between each of the emissive layers.

Figure 2A:
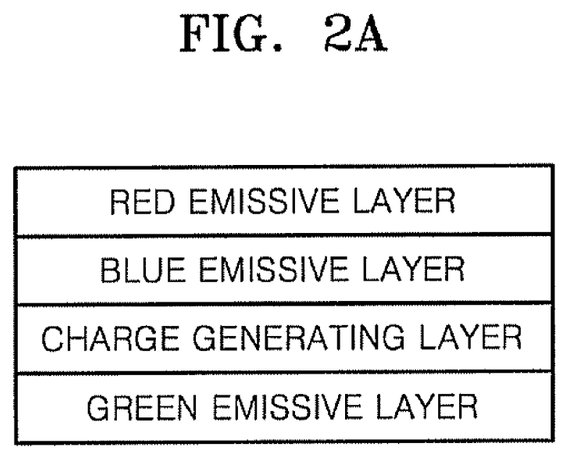
FIGS. 2A and 2B are exemplary schematic cross-sectional views illustrating the emissive layer structure a white organic light emitting device having a tandem structure as described herein.
Figure 2B:
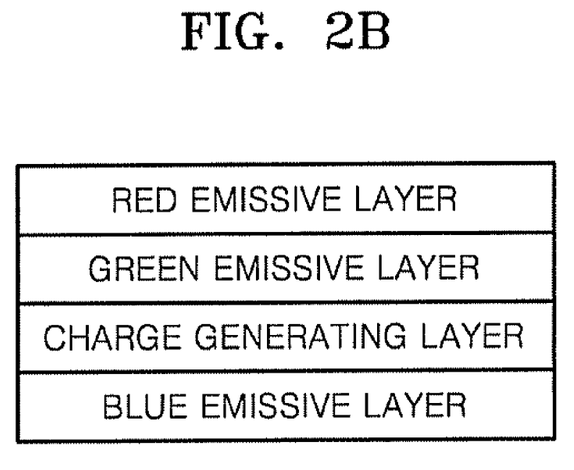

In the white organic light emitting device, the green, blue and red emissive layers can be formed in any order, and one charge generating layer is formed between any two layers selected from the group consisting of the green emissive layer, the blue emissive layer and the red emissive layer. Specifically, as illustrated in FIG. 2A, the emissive layers can be formed in the order of a green emissive layer, a blue emissive layer and a red emissive layer relative to the anode side, and a charge generating layer may be formed between the green emissive layer and the blue emissive layer. Alternatively, as illustrated in FIG. 2B, the emissive layers may be formed in the order of a blue emissive layer, a green emissive layer and a red emissive layer relative to the anode side, and a charge generating layer can be formed between the blue emissive layer and the green emissive layer.

The white organic light emitting device comprises only one charge generating layer, and thus the device has an asymmetrical structure such that a charge generating layer is formed between any two of the three emissive layers.

The charge generating layer is formed of one type of material. It is known that when two emissive layers are connected to one another by the charge generating layer, the efficiency of the current generated in one of the two emissive layers is doubled. For example, when a voltage is applied to a charge generating layer comprising an n-type aryl amine-based layer and a p-type metal oxide layer, an oxidation-reduction reaction occurs resulting in the formation of a complex and the generation of a charge.

According to another embodiment. The charge generating layer may comprise a charge generating compound selected from an aryl amine-based organic compound, metal oxides, metal carbides, metal fluorides, or the like, or a combination comprising at least one of the foregoing charge generating compounds.

Examples of aryl amine-based organic compounds include N,N'-dinaphthyl-N,N'-diphenyl bendizine ("α-NPD"), tris (2-naphthylphenylamino) triphenyl-amine ("2-TNATA"), 4,4',4"-tris(N,N-diphenyl-. amino) triphenylamine ("TDATA"), 4,4',4"-tris[N,N-(m-tolyl)phenylamino]triphenylamine ("MTDATA"), 2,2',7,7'-tetrakis(diphenylamino)-9,9'-spirobifluorene ("spiro-TAD"), N,N'-di(1-naphthyl)-N, N'-diphenyl-4,4'-diamonobiphenyl ("spiro-NPB"), or the like, or a combination comprising at least one of the foregoing aryl amine-based compounds.

Examples of the metal include those selected from the group consisting of Cs, Mo, V, Ti, W, Ba, Li, or the like, or a combination comprising at least one of the foregoing metals.

Examples of the metal oxides, metal carbides and metal fluorides include $Re_2O_7$, $MoO_3$, $V_2O_5$, $WO_3$, $TiO_2$, $Cs_2CO_3$, BaF, LiF, CsF, or the like, or a combination comprising at least one of the foregoing metal oxides, metal carbides and metal fluorides.

According to yet another embodiment, the emissive layers of the white organic light emitting device each comprise a host material and a fluorescent or phosphorescent light emitting material as a dopant.

Herein, the host material used to form an emissive layer is the same material used to form each of the blue, red and green emissive layers. Alternatively, the host material used to form the green and red emissive layers can be different from the host material used to form a blue emissive layer.

The host material can be generally any material that is used in a low molecular weight organic light emitting device. Examples of the host material include 9,10-bis-(β-naphthyl)-anthracene ("ADN"), 2-tert-butyl-9,10-bis-(β-naphthyl)-anthracene ("TBADN"), tris(8-quinolinolato)aluminum ("Alq$_3$"), or the like, or a combination comprising at least one of the foregoing host materials.

The blue dopant used to form the blue emissive layer is not particularly limited. Examples of the blue dopant include 4,4'-bis(2,2-diphenylvinyl)biphenyl ("DPAVBi"), derivatives of DPAVBi, distyrilarylene ("DSA"), derivatives of DSA, distyrilbenzene (DSB), derivatives of DSB, 2,2',7,7'-tetrakis(2,2-diphenylvinyl)-9,9-spirobifluorene ("spiro-DPVBi"), spiro-sexyphenyl ("spiro-6P"), or the like, or a combination comprising at least one of the foregoing blue dopants.

The red dopant used to form the red emissive layer is not particularly limited. Examples of the red dopant include 4-(dicyanomethylene)-2-t-butyl-6-(1,1,7,7-tetramethylju-lolidyl-9-enyl)-4H-pyran ("DCJTB"), 2,3,7,8,12,13,17,18-Octaethyl-21H,23H-porphine platinum (II) ("PtOEP"), RD 61 (from UDC), or the like, or a combination comprising at least one of the foregoing red dopants.

The green dopant used to form the green emissive layer is not particularly limited. Examples of the green dopant include Coumarin 6, Tris(2-phenylpyridine) iridium (III) ("Ir(PPy)3"), 2-phenylpyridine ("PPy", or the like, or a combination comprising at least one of the foregoing green dopants.

The white organic light emitting device described herein can be manufactured using prior art methods.

For example, an anode can be formed on a substrate, followed by the formation of green, blue and red emissive layers on the anode in any order. The charge generating layer is formed on one of the green, blue and red emissive layers such that the charge generating layer is formed between any two of the green, blue and red emissive layers.

The white organic light emitting device can further comprise a layer formed of an organic compound such as an electron transport layer ("ETL"), an electron injection layer ("EIL"), a hole transport layer ("HTL"), a hole injection layer ("HIL"), or a hole blocking layer ("HBL") in addition to the emissive layers ("EML") and the charge generating layer.

Examples of white organic light emitting device structures include: an anode/HIL/HTL/light EML with charge generating layer/ETL/EIL/cathode structure; an anode/HTL/light EML with charge generating layer/ETL/EIL/cathode structure; an anode/HIL/HTL/light EML with charge generating layer/HBL/ETL/EIL/cathode structure; or the like.

First, an electrode is formed by depositing or sputtering a high work-function material for an anode on a substrate. This first electrode can be used as an anode. The substrate, can be any transparent substrate that is used in conventional organic light emitting devices, that has excellent mechanical strength, thermal stability, transparency, and surface smoothness, can be easily treated, and is waterproof. Examples of transparent substrates include transparent inorganic substrates, such as quartz and glass, and transparent plastic substrates, such as polyethylene terephthalate ("PET"), polyethylene naphthalate ("PEN"), polycarbonate, polystyrene, polypropylene, polymethylmethacrylate, polyethersulfone ("PES") and the like; and a combination comprising at least one of the foregoing transparent substrates.

Any transparent materials having high conductivity can be used for an anode. Examples of transparent high conductivity materials include indium tin oxide ("ITO"), ZnO, indium-oxide-doped ZnO ("IZO"), SnO$_2$, or a combination comprising at least one of the foregoing transparent, conductive materials.

Then, an HIL can be formed on the anode using methods such as vacuum deposition, spin coating, casting, Langmuir Blodgett (LB) deposition, or the like.

When the HIL is formed by vacuum deposition, the vacuum deposition conditions can vary according to the compound that is used to form the HIL, the desired structure, and the thermal properties of the HIL to be formed. In general, however, the vacuum deposition can be performed at a deposition temperature of about 100 to about 500° C., a pressure of about $10^{-8}$ -to about $10^{-3}$ torr, a deposition speed of about 0.01 to about 100 Angstroms ("Å") per second ("Å/sec"), and to a layer thickness of about 10 Å to about 5 micrometers (μm).

When the HIL is formed by spin coating, the coating conditions can vary according to the compound that is used to form the HIL, the desired structure and the thermal properties of the HIL to be formed. In general, however, the coating speed can be about 2,000 to about 5,000 rotations per minute (rpm), and the temperature for heat treatment, which is performed to remove a solvent after coating, can be about 80 to about 200° C.

The material used to form the HIL can be known HIL materials. Examples of HIL materials include a phthalocyanine compound, for example copper phthalocyanine; a starburst type amine derivative, for example, 4,4',4"-Tri(N-carbazolyl)triphenylamine ("TCTA"), m-MTDATA, 1,3,5-tris[4-(3-methylphenylphenylamino)phenyl]benzene ("m-MTDAPB"); MoO$_3$; a soluble and conductive polymer such as polyaniline("PANI")/Dodecylbenzenesulfonic acid ("DSA") ("PANI/DBSA"); poly(3,4-ethylenedioxythiophene)("PEDOT")/poly(4-styrenesulfonate) ("PSS") ("PEDOT/PSS"): polyaniline/camphor sulfonic acid ("CSA") (Pani/CSA); PANI/PSS; or the like, or a combination comprising at least one of the foregoing HIL materials.

PANI/DBSA

PEDOT/PSS

The thickness of the HIL may be about 100 to about 10,000 Å, and specifically, about 100 to about 1,000 Å. When the thickness of the HIL is less than about 100 A, the hole injecting ability of the HIL may be reduced. On the other hand, when the thickness of the HIL is greater than about 10,000 Å, the turn-on voltage required by the organic light emitting device may be increased.

Then, an HTL can be formed on the HIL using methods such as vacuum deposition, spin coating, casting, LB, or the like. When the HTL is formed by vacuum deposition or spin coating, the deposition and coating conditions are similar to those used for the formation of the HIL, however the deposition and coating conditions can vary according to the material that is used to form the HTL.

Any know hole transporting material can be used to form the HTL. Examples of hole transporting materials include a carbazole derivative, for example, N-phenylcarbazole, or polyvinylcarbazole; a typical amine derivative having an aromatic condensation ring, for example, N,N'-bis(3-methylphenyl)-N,N'-diphenyl-[1,1-biphenyl]-4,4'-diamine ("TPD"), α-NPD, or the like, or a combination comprising at least one of the foregoing hole transport materials.

The thickness of the HTL may be about 50 to about 1,000 Å, and specifically, about 100 to about 600 Å. When the thickness of the HTL is less than about 50 Å, the hole transporting ability of the HTL can be reduced. On the other hand, when the thickness of the HTL is greater than about 1,000 Å, the turn-on voltage required by the organic light emitting device can increase.

Then, an EML with a charge generating layer can be formed on the HTL using methods such as vacuum deposition, spin coating, casting, LB deposition, or the like. When the EML is formed by vacuum deposition or spin coating, the deposition and coating conditions are similar to those for the formation of the HIL, however the deposition and coating conditions can vary according to the material that is used to form the EML.

The total thickness of the EML with the charge generating layer may be about 100 to about 5,000 Å, specifically about 500 to about 2,000 Å. When the thickness of the EML with the charge generating layer is less than about 100 Å, the light emitting ability may be reduced. On the other hand, when the thickness of the EML having the charge generating layer is greater than about 5,000 Å, the turn-on voltage required by the organic light emitting device may be increased.

To prevent triplet excitons or holes from being diffused into an ETL, an HBL can be formed on the HTL by vacuum deposition, spin coating, casting, LB deposition, or the like.

When the HBL is formed by vacuum deposition or spin coating, the deposition and coating conditions are similar to those for the formation of the HIL, however the deposition and coating conditions can vary according to the material that is used to form the HBL. Any known available hole blocking materials can be used. Examples of hole blocking material include an oxadiazole derivative, a triazole derivative, a phenanthroline derivative, 2,9-dimethyl-1,10-phenanthroline ("BCP"), an aluminum complex, or the like, or a combination comprising at least one of the foregoing hole blocking materials.

Phenanthroline-containing organic compound

Imidazole-containing organic compound

Triazole-containing organic compound

Oxadiazole-containing compound perylene-based compound

BAlq

Alq3

BAlq

SAlq

The thickness of the HBL may be about 50 to about 1,000 Å, and specifically, about 100 to about 300 Å. When the thickness of the HBL is less than about 50 Å, the hole blocking ability of the HBL can be reduced. On the other hand, when the thickness of the HBL is greater than about 1,000 Å, the turn-on voltage required by the organic light emitting device can increase.

Then, an ETL can be formed on the HBL using various methods such as vacuum deposition, spin coating, casting, LB, or the like. When the ETL is formed by vacuum deposition or spin coating, the deposition and coating conditions are similar to those for the formation of the HIL, however the deposition and coating conditions can vary according to the material that is used to form the ETL. The material used to form the ETL stably transports electrons injected from a cathode electrode, and can be a known material. Examples of electron transport materials include an oxazole-based compound, an isoxazole-based compound, a triazole-based compound, an isothiazole-based compound, an oxadiazole-based compound, a thiadiazole-based compound, a perylene-based compound, an aluminum complex, for example, Alq3, Bis(2-methyl-8-quinolinolato-N1,O8)-(1,1'-Biphenyl-4-olato)aluminum III ("Balq"), bis(2-methyl-8-quinolinato)triphenylsilanolate aluminum (III)("Salq"), tris(4-methyl-8-quinolinolato)aluminum(ill)("Almq3"; a gallium complex, for example, tris(2-methyl-8-quinolinolato) (pivalato-O) gallium(III) ("Gaq'2Opiv"), tris(2-methyl-8-quinolinolato)(acetato-O) gallium(III) ("Gaq'2OAc"), tris(2-methyl-8quinolinolato)gallium(III) (2("Gaq'2"), or the like.

Almq3

Gaq'2OPiv

Gaq'2Oac

2(Gaq'2)

The thickness of the ETL may be about 100 to about 1,000 Å, and specifically, about 200 to about 500 Å. When the thickness of the ETL is less than about 100 Å, the electron transporting ability of the ETL can be reduced. On the other hand, when the thickness of the ETL is greater than about 1,000 Å, the turn-on voltage required by the organic light emitting device can increase.

In addition, an EIL that promotes electron injection from a cathode may be formed on the ETL.

The EIL may be formed of any material used to form an EIL, which is known in the art. Examples of electron injection materials include LiF, NaCl, CsF, $Li_2O$, BaO, or $CsCO_3$ with BCP, or the like, or a combination comprising at least one of the foregoing electron injection materials. Conditions for the deposition of the EIL are, in general, similar to the conditions used for the formation of the HIL, however they can vary according to the material that is used to form the EIL.

The thickness of the EIL may be about 1 to about 100 Å, and specifically, about 5 to about 50 Å. When the thickness of the EIL is less than about 1 Å, the electron injecting ability of the EIL can be reduced. On the other hand, when the thickness of the EIL is greater than about 100 Å, the turn-on voltage required by the organic light emitting device can increase.

Finally, a second electrode can be formed on the EIL by vacuum deposition, sputtering, or the like. The second electrode can be used as a cathode. The second electrode may be formed of a low work-function metal, an alloy, an electrically conductive compound, or a combination comprising one or more of these materials. Examples of materials for the second electrode include Li, Mg, Al, Al—Li, Ca, Mg—In, Mg—Ag, or the like, or a combination comprising at least one of the foregoing electrode materials. Alternatively, a transparent cathode formed of ITO or IZO can be used to produce a front surface light emitting device.

The white organic light emitting device described herein does not require application to a specific device or a specific method of manufacture, and can be manufactured using a method for manufacturing a white organic light emitting device using prior art light emitting materials.

The present invention will now be described in greater detail with reference to the following examples. The following examples are for illustrative purposes only and are not intended to limit the scope of the invention.

EXAMPLES

Example 1

A white organic light emitting device having the following structure was manufactured: anode/HIL/HTL/ green emissive layer/ETL/n-type charge generating layer/p-type charge generating layer/blue emissive layer/red emissive layer/ETL/EIL/cathode. Specific materials used for each of the layers in the structure are as follows: ITO/MoO$_3$/α-NDP/2 weight % coumarin:Alq3/Alq3/Cs$_2$CO$_3$: BCP/MoO$_3$/α-NPD/5 weight % DPAVBi: TBADN/2 weight % DCJTB: Alq$_3$Alq$_3$Cs$_2$CO$_3$: BCP/Al A glass substrate having a thickness of 0.7 millimeters (mm) on which 90 nanometers (nm) of ITO was patterned, was washed using a synthetic detergent, deionized water, isopropyl alcohol, or the like, and then treated with UV ozone. An HIL formed of MoO$_3$ and a HTL formed of α-NPD were sequentially formed on the ITO substrate generally at a deposition temperature of about 100 to about 1,000° C., a pressure of about $10^{-8}$ -to about $10^{-3}$ torr, a deposition speed of about 0.1 to about 10 Å/sec, and to a layer thickness of about 50 to about 1,000 Å. A green emissive layer (host: Alq$_3$, dopant: coumarin) was formed on the hole transport layer at a deposition temperature of about 100 to about 500° C., a pressure of about $10^{-8}$ to about $10^{-3}$ torr, a deposition speed of about 0.1 to about 10 Å/sec, to a layer thickness of about 50 to about 1,000 Å, and in an amount ratio of about 2 parts by weight of the dopant per 100 parts by weight of the host. An ETL formed of Alq$_3$ was formed on the green emissive layer at a deposition temperature of about 100 to about 500° C., a pressure of about $10^{-8}$ to about $10^{-3}$ torr, a deposition speed of about 0.1 to about 10 Å/sec, and to a layer thickness of about 50 to about 1,000 Å. Then, an n-type charge generating layer formed of Cs$_2$CO$_3$ and BCP was formed on the electron transport layer at a deposition temperature of about 100 to about 1,000° C., a pressure of about $10^{-8}$ to about $10^{-3}$ torr, a deposition speed of about 0.1 to about 10 Å/sec, and to a layer thickness of about 50 to about 1,000 Å, wherein the ratio of Cs$_2$CO$_3$ to BCP was about 1:1. A p-type charge generating layer formed of MoO$_3$ was formed on the n-type charge generating layer at a deposition temperature of about 100 to about 1,000° C., a pressure of about $10^{-8}$ to about $10^{-3}$ torr, a deposition speed of about 0.1 to about 10 Å/sec, and to a layer thickness of about 50 to about 1,000 Å. Then, a blue emissive layer (host: TBADN, dopant: DPAVBi) formed in a ratio of about 5 parts by weight of the dopant per 100 parts by weight of the host, and a red emissive layer (host: Alq$_3$, dopant: DCJTB) formed in a ratio of about 5 parts by weight of the dopant per 100 parts by weight of the host, were sequentially formed on the p-type charge generating layer at a deposition temperature of about 100 to about 500° C., a pressure of about $10^{-8}$ to about $10^{-3}$ torr, a deposition speed of about 0.1 to about 10 Å/sec, and each to a layer thickness of about 50 to about 1,000 Å. Next, an ETL formed of Alq$_3$, and an EIL formed of Cs$_2$CO$_3$ and BCP in a ratio of about 1:1, were formed on the red emissive layer under the same conditions as those used in forming the ETL and the n-type charge generating layer. Finally, a cathode comprising Al was formed on the EIL at a deposition temperature of about 300 to about 1,000° C., a pressure of about $10^{-8}$ -to about $10^{-3}$ torr, a deposition speed of about 0.1 to about 10 Å/sec, and to a layer thickness of about 100 to about 2,000 Å.

Example 2

A white organic light emitting device having the following structure was manufactured: anode/HIL/HTL/blue emissive layer/ETL/n-type charge generating layer/p-type charge generating layer/green emissive layer/red emissive layer/ETL/EIL/cathode. Specific materials used for each of the layers in the structure are as follows: ITO/MoO$_3$/α-NDP/5 weight % DPAVBi: TBADN/Alq$_3$Cs$_2$CO$_3$: BCP/MoO$_3$/α-NPD/2 weight % coumarin: Alq$_3$2 weight % DCJTB: Alq$_3$Alq$_3$Cs$_2$CO$_3$: BCP/Al A white organic light emitting device was manufactured in the same manner as in Example 1, except that a blue emissive layer, a charge generating layer, a green emissive layer and a red emissive layer were sequentially formed in this order.

Comparative Example 1

A white organic light emitting device having the following structure was manufactured: ITO/MoO$_3$/α-NDP/2 weight % coumarin: Alq$_3$/5 weight % DPAVBi: TBADN/2 weight % DCJTB: Alq$_3$/Alq$_3$/Cs$_2$CO$_3$: BCP/Al A white organic light emitting device was manufactured in the same manner as in Example 1, except that a charge generating layer was not formed.

Comparative Example 2

A white organic light emitting device having the following structure was manufactured: ITO/MoO$_3$/α-NDP/5 weight % DPAVBi: TBADN/2 weight % coumarin: Alq$_3$/2 weight % DCJTB: Alq$_3$/Alq$_3$/Cs$_2$CO$_3$: BCP/Al A white organic light emitting device was manufactured in the same manner as in Example 2, except that a charge generating layer was not formed.

Comparative Example 3

A white organic light emitting device having the following structure was manufactured: ITO/MoO$_3$/α-NDP/2 weight % coumarin: Alq$_3$/Alq$_3$/Cs$_2$CO$_3$: BCP/MoO$_3$/α-NPD/5 weight % DPAVBi: TBADN/Cs$_2$CO$_3$: BCP/MoO$_3$/2 weight % DCJTB: Alq$_3$/Alq$_3$/Cs$_2$CO$_3$: BCP/Al A white organic light emitting device was manufactured in the same manner as in Example 1, except that two charge generating layers were formed: one between the green emissive layer and the blue emissive layer, and one between the blue emissive layer and the red emissive layer.

Comparative Example 4

A white organic light emitting device having the following structure was manufactured: ITO/MoO$_3$/α-NDP/5 weight % DPAVBi: TBADN/Alq$_3$Cs$_2$CO$_3$: BCP/MoO$_3$/α-NPD/2 weight % coumarin: Alq$_3$/Cs$_2$CO$_3$: BCP/MoO$_3$/2 weight % DCJTB: Alq$_3$/Alq$_3$/Cs$_2$CO$_3$: BCP/Al A white organic light emitting device was manufactured in the same manner as in Example 2, except that two charge generating layers were formed, one between the blue emissive layer and the green emissive layer and, one between the green emissive layer and the red emissive layer.

Evaluation

Maximum efficiencies, color purities, and turn-on voltages of the white organic light emitting devices of Examples 1 and 2, and Comparative Examples 1 through 4 were measured. The results are shown in the Table 1 below:

TABLE 1

| | Characteristics of white organic light emitting device | | |
|---|---|---|---|
| | Maximum efficiency (cd/A) | Color Coordinate (x, y) | Turn-on Voltage (V) |
| Example 1 | 8.51 | 0.28, 0.32 | 5.4/11.4 |
| Example 2 | 6.75 | 0.32, 0.32 | 3.8/13.0 |
| Comparative Example 1 | 7.38 | 0.29, 0.39 | 2.8/6.2 |
| Comparative Example 2 | 6.33 | 0.38, 0.40 | 3.0/6.8 |
| Comparative Example 3 | 9.08 | 0.26, 0.40 | 8.2/19.2 |
| Comparative Example 4 | 12.01 | 0.27, 0.38 | 9.0/19.0 |

Figure 3:
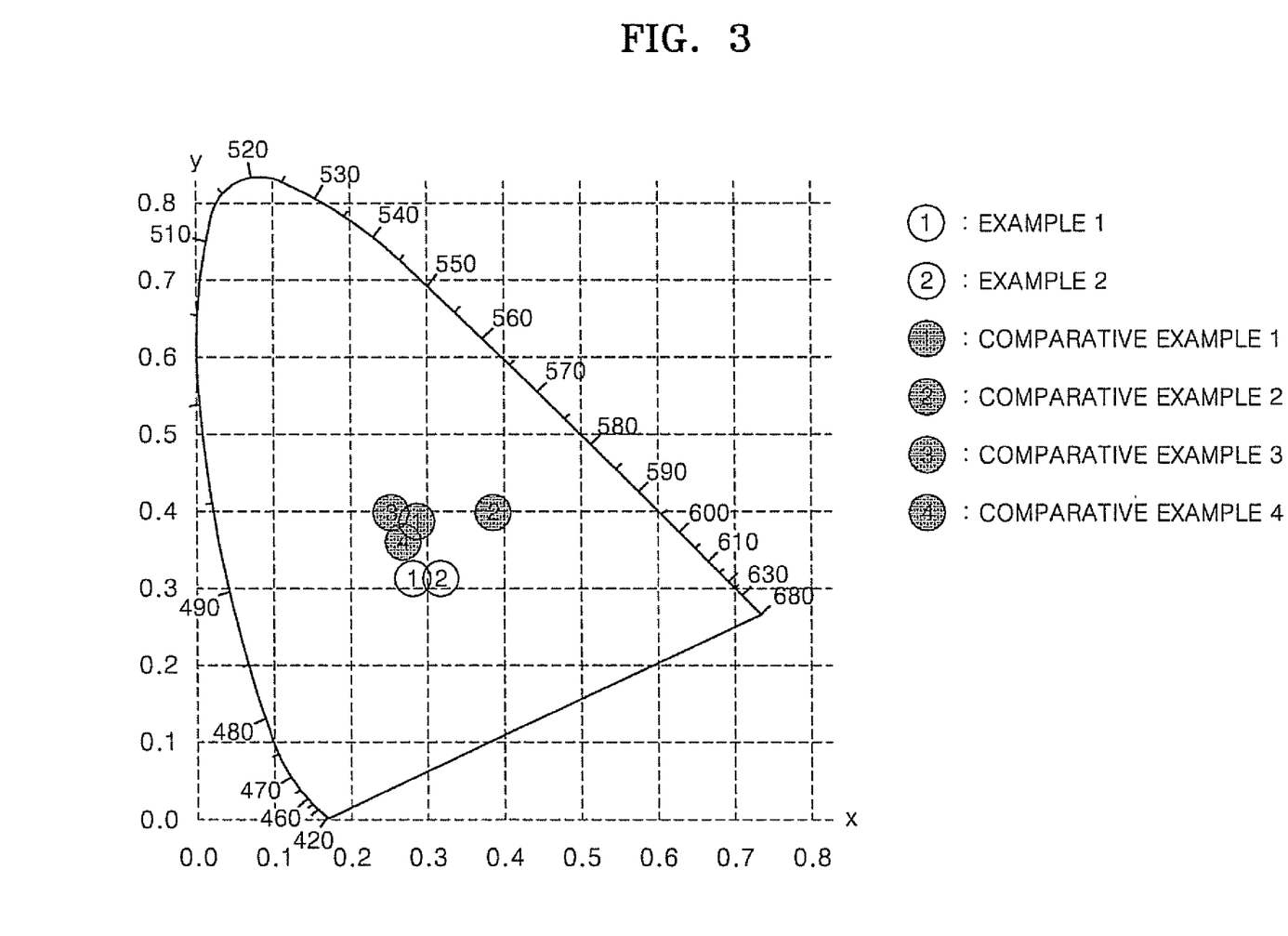
FIG. 3 is a graph illustrating the color coordinates of white organic light emitting devices prepared as described in the Examples and in the Comparative Examples.

FIG. 3 is a graph illustrating the luminescence spectra of the white organic light emitting devices of Examples 1 and 2, and Comparative Examples 1 through 4.

From the results shown in the Table 1, it can be seen that the exemplary devices prepared as described in Examples 1 and 2, in which one charge generating layer is formed between two layers selected from the green emissive layer, the blue emissive layer and the red emissive layer exhibits a higher or similar light emission efficiency and higher color purity, as compared to the Comparative Examples 1 and 2 which do not include a charge generating layer therebetween.

In addition, from the results shown in the Table 1, it can be seen that the exemplary devices prepared as described in Examples 1 and 2, exhibit a slightly lower light emission efficiency as compared to Comparative Examples 3 and 4 in which two charge generating layers are formed between each of a green emissive layer, a blue emissive layer and a red emissive layer. However, Examples 1 and 2 do exhibit a higher color purity and a lower turn-on voltage as compared to Comparative Examples 3 and 4.

The white organic light emitting device described herein has a simple tandem structure, thereby having both improved color balance and light emission efficiency. Therefore, it can be effectively used in display and lighting devices.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A white organic light emitting device comprising:
an anode,
a cathode, and
an organic layer formed between the anode and the cathode, wherein the organic layer comprises one green emissive layer, one blue emissive layer, one red emissive layer, and only one charge generating layer formed between any two of the foregoing green, blue and red emissive layers,
wherein the charge generating layer comprises a charge generating compound selected from a metal, metal oxides, metal carbides, metal fluorides, or a combination comprising at least one of the foregoing charge generating compounds, and
the charge generating layer contacts at least one of the green emissive layer, the blue emissive layer, and the red emissive layer.

2. The white organic light emitting device of claim 1, wherein the metal is selected from Cs, Mo, V, Ti, W, Ba or Li, or a combination comprising at least one of the foregoing metals.

3. The white organic light emitting device of claim 1, wherein the metal oxides, metal carbides and metal fluorides are selected from $Re_2O_7$, $MoO_3$, $V_2O_5$, $WO_3$, $TiO_2$, $Cs_2CO_3$, BaF, LiF, or CsF, or a combination comprising at least one of the foregoing metal oxides, metal carbides and metal fluorides.

4. The white organic light emitting device of claim 1, wherein the green emissive layer, the blue emissive layer and the red emissive layer each comprise a host material, and a fluorescent or phosphorescent light emitting material as a dopant.

5. The white organic light emitting device of claim 1, wherein the emissive layers of the organic layer are formed from the anode side in the order of the green emissive layer, the blue emissive layer and the red emissive layer.

6. The white organic light emitting device of claim 5, wherein a charge generating layer is formed between the green emissive layer and the blue emissive layer.

7. The white organic light emitting device of claim 1, wherein the emissive layers of the organic layer are formed from the anode side in the order of the blue emissive layer, the green emissive layer and the red emissive layer.

8. The white organic light emitting device of claim 7, wherein a charge generating layer is formed between the blue emissive layer and the green emissive layer.

9. The white organic light emitting device of claim 4, wherein the green emissive layer comprises $Alq_3$ as the host material and coumarin as the dopant.

10. The white organic light emitting device of claim 4, wherein the blue emissive layer comprises 2-tert-butyl-9,10-bis-(β-naphthyl)-anthracene as the host material and 4,4'-bis(2,2-diphenylvinyl)biphenyl as the dopant.

11. The white organic light emitting device of claim 4, wherein the red emissive layer comprises $Alq_3$ as the host material and 4-(dicyanomethylene)-2-t-butyl-6-(1,1,7,7-tetramethyljulolidyl-9-enyl)-4H-pyran as the dopant.

12. The white organic light emitting device of claim 1, wherein the organic layer further comprises at least one layer selected from a hole injection layer, an electron blocking layer, a hole transport layer, an electron transport layer, an electron injection layer, a hole blocking layer or an electron injection layer, or a combination comprising at least one of the foregoing layers.

* * * * *